US010411006B2

(12) United States Patent
Langguth et al.

(10) Patent No.: US 10,411,006 B2
(45) Date of Patent: Sep. 10, 2019

(54) POLY SILICON BASED INTERFACE PROTECTION

(71) Applicant: Infineon Technologies AG, Neubiberg (DE)

(72) Inventors: Gernot Langguth, Oberhaching (DE); Adrien Ille, Unterhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 58 days.

(21) Appl. No.: 15/149,527

(22) Filed: May 9, 2016

(65) Prior Publication Data
US 2017/0323882 A1   Nov. 9, 2017

(51) Int. Cl.
*H01L 27/02* (2006.01)
*H01L 27/12* (2006.01)
(Continued)

(52) U.S. Cl.
CPC .... *H01L 27/0296* (2013.01); *H01L 21/28518* (2013.01); *H01L 23/60* (2013.01); *H01L 25/0657* (2013.01); *H01L 27/0292* (2013.01); *H01L 27/1207* (2013.01); *H01L 23/3128* (2013.01); *H01L 24/16* (2013.01); *H01L 24/48* (2013.01); *H01L 24/73* (2013.01); *H01L 27/0255* (2013.01); *H01L 27/0259* (2013.01); *H01L 27/0266* (2013.01); 
(Continued)

(58) Field of Classification Search
CPC ............. H01L 27/0296; H01L 27/0292; H01L 27/0266; H01L 27/0255; H01L 27/0288; H01L 27/0259; H01L 25/043; H01L 25/0657; H01L 25/074; H01L 25/0756; H01L 25/117; H01L 21/04; H01L 21/761; H01L 27/0262; H01L 27/098; H01L 29/0615; H01L 29/0646; H01L 29/66121; H01L 29/66136; H01L 29/66166; H01L 29/66174; H01L 27/0248
See application file for complete search history.

(56) References Cited

U.S. PATENT DOCUMENTS 4,617,482 A * 10/1986 Matsuda .......... H03K 19/00315
257/358
4,760,434 A *  7/1988 Tsuzuki .................. H01L 23/34
257/328
(Continued)

FOREIGN PATENT DOCUMENTS

DE        102010045325 A1     4/2011

OTHER PUBLICATIONS

Ker, Ming-Dou, et al., "On-chip ESD protection design by using polysilicon diodes in CMOS process", Apr. 2001, IEEE Journal of Solid-State Circuits 36.4, p. 676-686.*
(Continued)

*Primary Examiner* — Allen L Parker
*Assistant Examiner* — Pauline Vu
(74) *Attorney, Agent, or Firm* — Slater Matsil, LLP

(57) ABSTRACT

A semiconductor device includes an active device of a transistor disposed in a semiconductor substrate. An isolation layer is disposed at the semiconductor substrate, and a polysilicon substrate layer is disposed over the isolation layer and the semiconductor substrate. The polysilicon substrate layer includes a semiconductor device region of an interface protection circuit of the transistor.

14 Claims, 11 Drawing Sheets

(51) Int. Cl.
*H01L 25/065* (2006.01)
*H01L 21/285* (2006.01)
*H01L 23/60* (2006.01)
*H01L 23/31* (2006.01)
*H01L 23/00* (2006.01)

(52) U.S. Cl.
CPC .. *H01L 27/0288* (2013.01); *H01L 2224/0401* (2013.01); *H01L 2224/04042* (2013.01); *H01L 2224/16145* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/73207* (2013.01); *H01L 2224/73265* (2013.01); *H01L 2225/0651* (2013.01); *H01L 2225/0652* (2013.01); *H01L 2225/06513* (2013.01); *H01L 2225/06568* (2013.01); *H01L 2924/15311* (2013.01)

(56) References Cited

U.S. PATENT DOCUMENTS

| | | | | |
|---|---|---|---|---|
| 5,139,959 | A * | 8/1992 | Craft | H01L 27/0248 148/DIG. 11 |
| 5,572,394 | A * | 11/1996 | Ker | H01L 27/0259 361/111 |
| 5,637,900 | A * | 6/1997 | Ker | H01L 27/0251 257/355 |
| 5,717,559 | A * | 2/1998 | Narita | H01L 27/0255 361/111 |
| 5,825,067 | A * | 10/1998 | Takeuchi | H01L 27/0248 257/355 |
| 6,180,426 | B1 * | 1/2001 | Lin | G01R 31/31905 257/E21.705 |
| 6,242,763 | B1 * | 6/2001 | Chen | H01L 27/0262 257/107 |
| 6,268,242 | B1 * | 7/2001 | Williams | H03K 17/04123 257/331 |
| 6,323,518 | B1 * | 11/2001 | Sakamoto | H01L 23/62 257/330 |
| 6,351,363 | B1 * | 2/2002 | Wang | H01L 27/0255 361/111 |
| 6,385,028 | B1 * | 5/2002 | Kouno | H01L 27/0629 257/E27.016 |
| 6,424,013 | B1 * | 7/2002 | Steinhoff | H01L 27/0277 257/355 |
| 6,781,805 | B1 * | 8/2004 | Urakawa | H01L 27/0251 361/111 |
| 6,933,573 | B2 * | 8/2005 | Ker | H01L 21/84 257/355 |
| 6,967,381 | B2 * | 11/2005 | Tatehara | H01L 27/0251 257/355 |
| 8,315,024 | B2 | 11/2012 | Russ et al. | |
| 2001/0025963 | A1 * | 10/2001 | Tashiro | H01L 21/84 257/173 |
| 2001/0038126 | A1 * | 11/2001 | Liou | H01L 27/0255 257/355 |
| 2002/0000609 | A1 * | 1/2002 | Yasuda | H01L 27/0255 257/330 |
| 2002/0086467 | A1 * | 7/2002 | Chang | H01L 27/0255 438/155 |
| 2002/0109153 | A1 * | 8/2002 | Ker | H01L 27/0251 257/199 |
| 2005/0173727 | A1 * | 8/2005 | Manna | H01L 27/0262 257/173 |
| 2006/0097349 | A1 * | 5/2006 | Shaw | H01L 28/20 257/536 |
| 2006/0103421 | A1 * | 5/2006 | Hirata | H01L 23/50 326/62 |
| 2006/0118908 | A1 * | 6/2006 | Erickson | H01L 27/0802 257/536 |
| 2006/0157791 | A1 * | 7/2006 | Lee | H01L 27/0251 257/357 |
| 2007/0029646 | A1 * | 2/2007 | Voldman | H01L 23/60 257/662 |
| 2007/0138558 | A1 * | 6/2007 | Saitoh | H01L 21/823878 257/350 |
| 2007/0252168 | A1 * | 11/2007 | Shimoida | H01L 27/0255 257/147 |
| 2008/0001646 | A1 * | 1/2008 | Lui | H01L 27/0255 327/427 |
| 2008/0002320 | A1 * | 1/2008 | Gossner | H01L 27/0266 361/56 |
| 2008/0013231 | A1 * | 1/2008 | Bazzano | H01L 27/0259 361/56 |
| 2008/0036002 | A1 * | 2/2008 | Kishiro | H01L 27/0288 257/350 |
| 2008/0079079 | A1 * | 4/2008 | Noguchi | H01L 27/0255 257/355 |
| 2009/0283898 | A1 * | 11/2009 | Janzen | H01L 21/76898 257/698 |
| 2010/0059869 | A1 * | 3/2010 | Kaskoun | H01L 21/76898 257/665 |
| 2010/0133678 | A1 * | 6/2010 | Saiki | H01L 23/481 257/686 |
| 2011/0062545 | A1 * | 3/2011 | Nakajima | H01L 27/0255 257/470 |
| 2011/0156249 | A1 * | 6/2011 | Chang | H01L 23/481 257/737 |
| 2012/0002392 | A1 * | 1/2012 | Karp | H01L 23/60 361/820 |
| 2012/0154962 | A1 | 6/2012 | Russ et al. | |
| 2012/0299108 | A1 * | 11/2012 | Harada | H01L 21/84 257/355 |
| 2013/0256746 | A1 * | 10/2013 | Nakamura | H01L 27/0647 257/140 |
| 2014/0001473 | A1 * | 1/2014 | Chen | H01L 29/861 257/49 |
| 2014/0029145 | A1 * | 1/2014 | Mayerhofer | H01L 27/0255 361/56 |
| 2014/0070361 | A1 * | 3/2014 | Benaissa | H01L 27/0802 257/509 |
| 2015/0115342 | A1 * | 4/2015 | Kaya | H01L 29/7816 257/296 |
| 2016/0240527 | A1 * | 8/2016 | Ramachandran | H01L 23/147 |

OTHER PUBLICATIONS

Yibo, J., et al., "Investigation of the Polysilicon p-i-n Diode and Diode String as a Process Compatible and Portable ESD Protection Device," Journal of Semiconductors, vol. 3, No. 7, Jul. 2012, 5 pages.

* cited by examiner

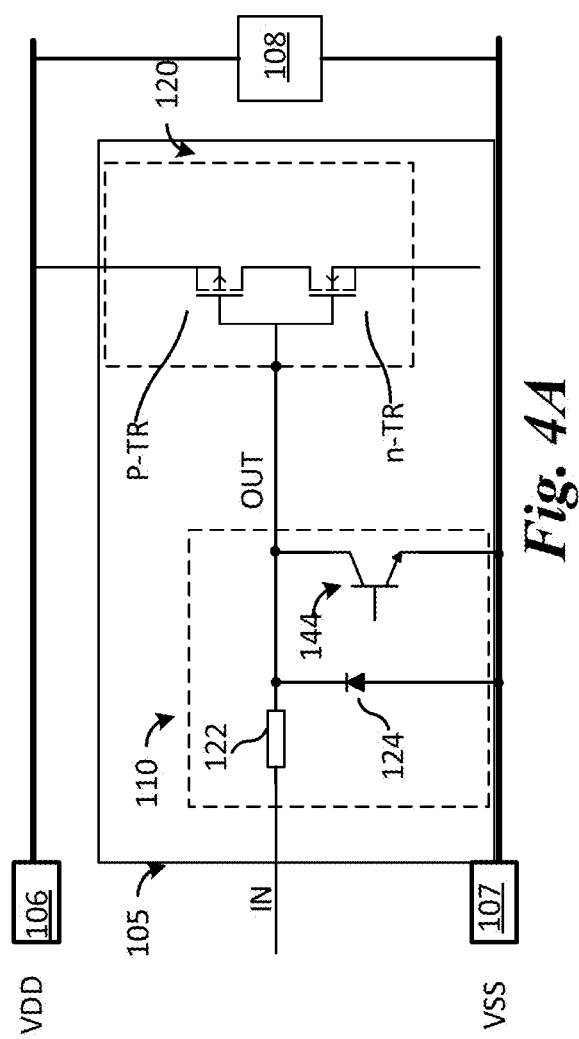

| polysilicon substrate layer 230 | first gate and second gate 216 and 217 |
| p-type base region 232 | doped in-situ |
| p-type polysilicon regions 234 | p-type source/drain regions 213 |
| n-type polysilicon regions 236 | n-type source/drain regions 212 |
| isolation trench 235 | spacers 218/219 |
| contact pads 238 | silicide contacts to transistors |

*Fig. 6*

POLY SILICON BASED INTERFACE PROTECTION

TECHNICAL FIELD

The present invention relates generally to semiconductor devices, and, in particular embodiments, to poly silicon based interface protection.

BACKGROUND

Electrical Overstress (EOS) is considered as the exposure of a device or an integrated circuit (IC) to a current or voltage beyond its absolute maximum ratings. EOS can occur due to voltage overshoots resulting in high destructive currents.

One type of EOS is Electrostatic Discharge (ESD), which is known as transfer of electrostatic charge between bodies or surfaces at different electrostatic potential. ESD can happen due to sudden discharge of charge from a charged body. The ESD occurs when differently-charged objects are brought close together or when the dielectric between them breaks down, often creating a visible spark. ESD is a high current event in the typical range of 0.1 A to 30 A in a very short period of time from 1 ns to 200 ns.

Many ICs include electrostatic discharge (ESD) protection circuits designed to protect the ICs against transient voltages such as ESD events and surges. An ESD protection circuit typically is designed to turn on during an ESD event and form a current discharge path to shunt the large ESD current and clamp the voltage of input/output (I/O) and supply pads to a sufficiently low level to prevent the IC from being damaged. The current shunting path is often provided by an active device that provides a conduction path with a relatively low on-resistance, for example. The ESD protection circuit typically ensures a low resistance path to prevent voltages from building up to potentially damaging levels.

In addition to primary ESD protection circuits described above, deep-submicron CMOS ICs typically need secondary ESD protection devices at signal interfaces between I/O and core regions or between different supply domains on one chip. Interface protection is also required for die to die interfaces when it comes to 3D integration of several chips in one package. Interface protection is typically small (compared to a primary ESD protection) but has to be placed at many locations within an IC.

Sensitive electronic components have to be protected from ESD not only during operation but also during manufacturing, assembly, shipping, and other steps during the entire life cycle of the product. For example, when a charged device is made to contact a grounded pin, for example, during packaging or assembly, the charge from the device is discharged quickly (ns range). Depending on the source of the ESD, the energy of the ESD pulse as well as the required protection are different.

SUMMARY

In accordance with an embodiment of the present invention, a semiconductor device comprises an active device of a transistor disposed in a semiconductor substrate, an isolation layer disposed at the semiconductor substrate, and a polysilicon substrate layer disposed over the isolation layer and the semiconductor substrate. The polysilicon substrate layer comprises a semiconductor device region of an interface protection circuit of the transistor.

In accordance with an alternative embodiment of the present invention, a semiconductor package comprises a semiconductor chip. The chip comprises a semiconductor substrate and a polysilicon substrate layer disposed over the semiconductor substrate. A plurality of interface protection circuits is disposed in the polysilicon substrate layer. The chip further includes a plurality of bond pads, each of the plurality of interface protection circuits associated with a corresponding one of the plurality of bond pads.

In accordance with an embodiment of the present invention, a method of forming a semiconductor device comprises depositing a polysilicon layer over a semiconductor substrate, and patterning the polysilicon layer to form a gate of a transistor, a diode, and a resistor. The diode and the resistor are part of an interface protection circuit for protecting the transistor from an electrostatic discharge current.

BRIEF DESCRIPTION OF THE DRAWINGS

For a more complete understanding of the present invention, and the advantages thereof, reference is now made to the following descriptions taken in conjunction with the accompanying drawings, in which:

FIG. 4A illustrates a schematic of the ESD protection system comprising a bipolar transistor in accordance with an alternative embodiment of the present invention;

FIG. 6 illustrates a table comprising fabrication steps to form the interface protection circuit that are shared with a CMOS process flow in accordance with an embodiment of the present invention.

DETAILED DESCRIPTION OF ILLUSTRATIVE EMBODIMENTS

Efficient over-voltage protection is an integral part of IC/ASIC design for system reliability. Field failure is perceived as poor quality by disappointed customers and increases the number of warranty returns. Overlooking this issue may seriously impact a company's image and profitability.

Therefore, protection devices are integral to the success of a product. At the same time, the cost of the protection devices has to be within reasonable limits. In other words, reliable but cheap protection devices are needed.

Embodiments of the present invention achieve these and other goals by integrating the interface protection circuits for protecting active circuitry within the semiconductor chip over the same substrate as the semiconductor chip. In various embodiments, the interface protection circuits are entirely formed within a polysilicon layer formed over the semiconductor substrate. The processes for forming the device regions of the interface protection circuits in the polysilicon layer are commonly shared with the corresponding CMOS process flow fabricating the functional blocks and circuitry of the semiconductor chip.

A schematic illustration of the interface protection circuit will be described using FIG. 1A, and further alternatives will be described using FIGS. 3A and 4A. Cross-sectional view of the structure showing the integration of the polysilicon devices with the CMOS devices will be described using FIGS. 1B, 2, 3B-3C, 4B-4C. A semiconductor package using embodiments of the invention will be described using FIG. 5. The fabrication processes showing some of the commonly shared process/mask steps will be described using FIG. 6.

Figure 1A:
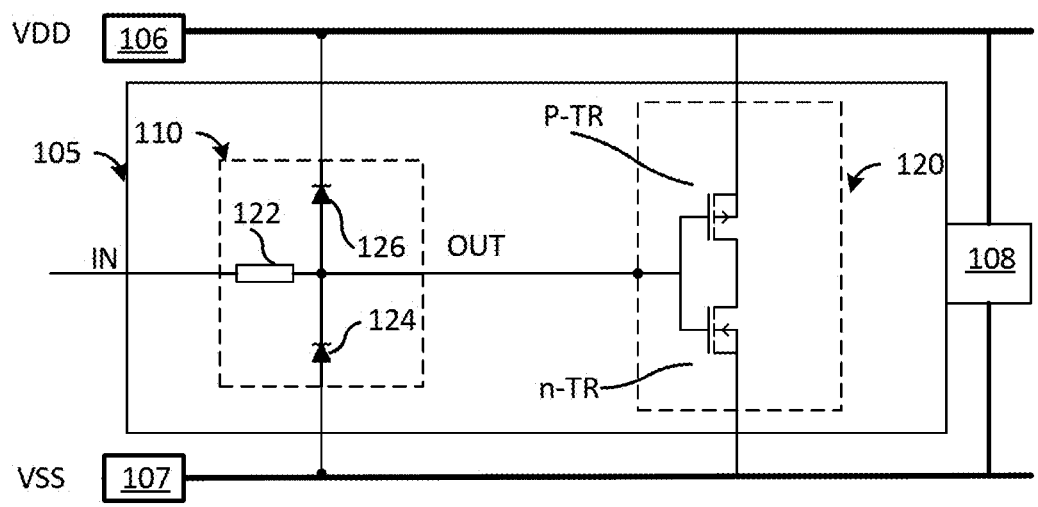
FIG. 1A illustrates a schematic drawing of an ESD protection system in accordance with embodiments of the present invention.

FIG. 1A illustrates a schematic drawing of an ESD protection system in accordance with embodiments of the present invention.

Referring to FIG. 1A, the device to be protected (DUP) 120 is coupled to a first power supply line (VDD) via a connector 106, such as a pad, a pin, and the like. The DUP 120 may also be coupled to a second power supply line, e.g., a negative supply voltage (VSS), such as ground, via a connector 107. The first power supply line and the second power supply line may provide potential to components of the DUP 120. For example, the first power supply line may be utilized to drive PMOS transistors of the DUP 120, while the second power supply line may be utilized to drive NMOS transistors of the DUP 120. The first power supply line and the second power supply line may be provided by external off-chip sources or generated on-chip.

In various embodiments, DUP 120 may be any circuit being protected from ESD or surge events. For example, the DUP 120 may include logic to perform operations of a semiconductor chip included in a particular computing device, such as a personal semiconductor, a laptop semiconductor, a netbook semiconductor, a personal digital assistant (PDA), a portable gaming device, a wireless communication device (e.g., a smart phone, a mobile handset, etc.), a set-top box, a game console, a portable music player, a router, a household appliance, a personal item (e.g., a wristwatch, calculator, etc.), other network connected devices, and so forth.

In various embodiments, a clamping circuit 108 may be coupled between the connector 106 and the connector 107 to provide ESD protection between the first power supply line and the second power supply line. The clamping circuit 108 may include one or more MOS transistors, one or more bipolar transistors, one more silicon controlled rectifiers (SCRs), one or more diodes, one or more capacitors, or a combination thereof. The clamping circuit 108 may be a dedicated discrete device in one embodiment.

The ESD protection system also includes an interface protection circuit 110 capable of protecting the DUP 120 from smaller magnitude ESD events. In comparison, the clamping circuit 108 may be capable of protecting DUP 120 from high energy ESD events. Unlike the clamping circuit 108, the interface protection circuit 110 is designed for protection from lower energy ESD events, for example, a few tens to hundreds of volt and discharge currents of up to 1 amp. Such events may happen inside a chip between internal power domains when the external pins of the whole device are exposed (e.g., contacting) to an ESD event like HBM or CDM discharges. In another embodiment, the interface protection circuit may be used to prevent lower energy ESD events between chips in a 3-D chip stack either during manufacturing or assembly, or later during operation.

As is described further herein below, the interface protection circuit 110 may include numerous components with numerous protected nodes and numerous ICs with numerous input or output pins. In various embodiments, the DUP 120 may also further include ESD circuits that are similar to the interface protection circuit 110 to prevent other circuits of the DUP 120 from smaller magnitude ESD events between different power domains within the DUP 120. In other words, the more than one of the interface protection circuit may be formed within each semiconductor chip 105. Referring to FIG. 1A, the DUP 120 may include transistors driven through the output node of the interface protection circuit 110. In FIG. 1A, as an illustration, the DUP 120 comprises an inverter having a p-channel transistor (P-TR) and an n-channel transistor (N-TR). The interface protection circuit 110 prevents the transistors from being damaged due an ESD event.

In various embodiments, the interface protection circuit 110 may comprise different types of ESD devices. In one embodiment, the interface protection circuit 110 comprises a resistor 122, a first diode 124, and a second diode 126.

The input signal, from a signal line, to the DUP 120 is received at the input node IN and then transferred to the DUP 120 through the output node (OUT) of the interface protection circuit 110. Any ESD is discharged either to the first power supply line or to the second power supply line. For example, a negative ESD event at the input node IN will be discharged through the first diode 124 while a positive pulse will be discharged through the second diode 126. Accordingly, the resistor 122, and first diode 124, and the second diode 126 help to remove ESD stress on incoming signal lines so as to protect the DUP 120.

In various embodiments, the interface protection circuit 110 and the DUP 120 are part of the same semiconductor chip 105 as will be described further using FIG. 1B.

Figure 1B:
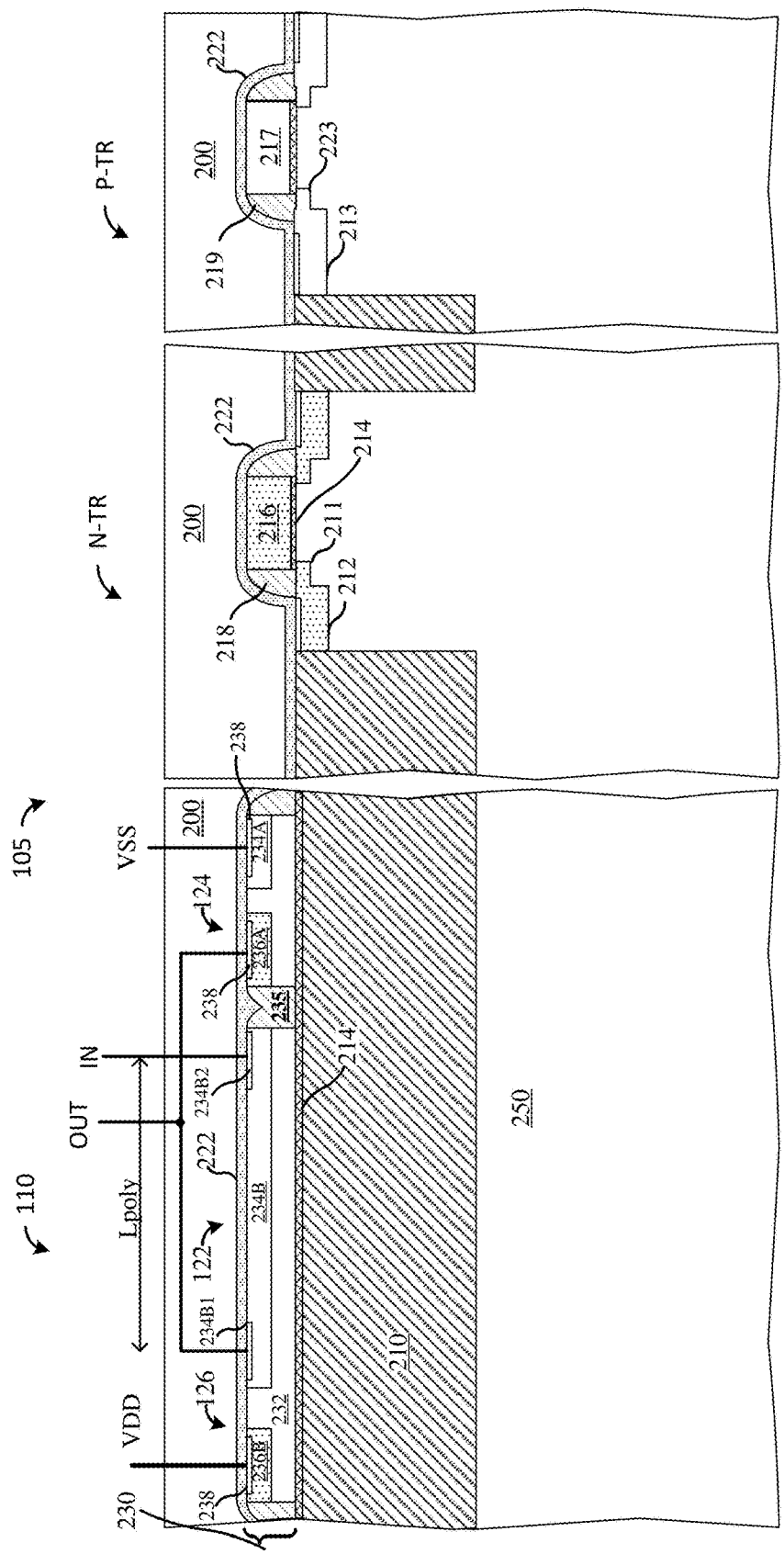
FIG. 1B illustrates a cross-sectional view of a semiconductor device in accordance with an embodiment of the present invention.

FIG. 1B illustrates a cross-sectional view of a semiconductor device in accordance with an embodiment of the present invention.

The semiconductor chip 105 includes multiple regions, for example, may include a first portion 1, a second portion 2, and a third portion 3. The first portion 1 comprises the interface protection circuit 110 while the second portion 2 and the third portion 3 may include functional circuitry of the semiconductor device. For example, as an illustration, the second portion 2 comprises an n-channel transistor (N-TR) while the third portion 3 comprises a p-channel transistor (P-TR). The n-channel transistor (N-TR) and the p-channel transistor (P-TR) are formed on a semiconductor substrate 250.

In various embodiments, the n-channel transistor (N-TR) and the p-channel transistor (P-TR) are formed using a CMOS process flow. The semiconductor substrate 250 may be a bulk semiconductor substrate such as a silicon substrate, a silicon on insulator substrate, a germanium substrate, a gallium nitride substrate including a gallium nitride on silicon substrate, silicon carbide substrate including a silicon carbide on silicon substrate, gallium arsenide, and others. The semiconductor substrate 250 may include epitaxial layers.

The n-channel transistor (N-TR) comprises n-type source/drain regions 212, n-type drain extension regions 211, halo regions (not shown), channel region between the n-type drain extension regions 211, first gate 216, and first spacer 218. Although not illustrated, the n-type source/drain regions 212 and the n-type drain extension regions 211 may include embedded silicon carbon regions. A etch stop liner 222 is disposed over the first gate 216, and the n-type source/drain regions 212. The n-channel transistor may be electrically isolated from adjacent devices by the isolation regions 210.

The p-channel transistor (P-TR) comprises p-type source/drain regions 213, p-type drain extension regions 223, halo regions (not shown), channel region between the p-type drain extension regions 223, second gate 217, and second spacer 219. The p-type source/drain regions 213 and the p-type drain extension regions 223 may include embedded silicon germanium regions. The etch stop liner 222 is also disposed over the second gate 217 and the p-type source/drain regions 213. The p-channel transistor may be electrically isolated from adjacent devices by the isolation regions 210.

The n-channel transistor (N-TR) and the p-channel transistor (P-TR) are covered with the etch stop liner 222 and an insulating layer 200. The etch stop liner 222 may be a stress liner in various embodiments. Further metallization levels may be formed over the insulating layer 200.

The interface protection circuit 110 in the first portion 1 is formed in a polysilicon substrate layer 230. The polysilicon substrate layer 230 may be formed over the isolation region 210 in the first portion 1. The polysilicon substrate layer 230 may be 60 nm to about 200 nm in various embodiments. A gate dielectric layer 214 may also separate the polysilicon substrate layer 230 from the isolation region 210. The polysilicon substrate layer 230 may be doped as an intrinsic layer or may be doped to low concentrations, for example, having a doping less than $10^{17}$ cm$^3$. In various embodiments described below, the polysilicon substrate layer 230 is doped to be a low doped p-type region. In various embodiments, n-type polysilicon regions 236 and p-type polysilicon regions 234 are formed in the polysilicon substrate layer 230. The n-type polysilicon regions 236 and the p-type polysilicon regions 234 are heavily doped having doping of at least $10^{18}$ cm$^{-3}$, and therefore counter-dope the doping of the polysilicon substrate layer 230. The remaining portion of the polysilicon substrate layer 230 is the p-type base region 232, which is the low doped p-type region remaining after forming the heavily doped n-type polysilicon regions 236 and p-type polysilicon regions 234.

A first diode 124 is formed within the polysilicon substrate layer 230. The first diode 124 comprises a first n-type region 236A and a first p-type region 234A. The first n-type region 236A and the first p-type region 234A form the first diode 124.

A resistor 122 is formed within the polysilicon substrate layer 230. The resistor 122 comprises a second p-type region 234B. The second p-type region 234B has a length Lpoly producing a resistance between the contact pads 234B1 and 234B2. The resistance of the resistor 122 is produced between the contact pads 234B1 and 234B2.

The resistor 122 is isolated from the first diode 124 by an isolation trench 235. the isolation trenches 235 may be formed using the processes used to form the spacers in the transistors N-TR and P-TR. Additionally, because both the resistor 122 and the first diode 124 are disposed over the isolation region 210, there is no parasitic coupling between the devices through the underlying isolation region 210.

A second diode 126 is disposed over the isolation region 210 and formed within the polysilicon substrate layer 230. The second diode 126 comprises a second n-type region 236B. The second n-type region 236B and the p-type base region 232 form the second diode 126.

In some embodiments, the spacing between the second n-type region 236B and the second p-type region 234B may be controlled to form the desired device. For example, if the spacing is small, the second n-type region 236B and the second p-type region 234B may physically contact each other forming a p+/n+ diode.

Similar to the n-channel transistor (N-TR) and the p-channel transistor (P-TR), the interface protection circuit 110 is also covered with the etch stop liner 222 and an insulating layer 200. The etch stop liner 222 may be a stress liner in various embodiments. Further metallization levels may be formed over the insulating layer 200.

In various embodiments, the width (as measured extending into the paper) of the resistor 122, the first diode 124, and the second diode 126 are about the same.

As illustrated in FIG. 1B, the contact pad 238 of the first p-type region 234A is coupled to the second power supply line VSS while the contact pad 238 of the first n-type region 236A is coupled to a contact pad 234B1 of the resistor 122. Although illustrated in FIG. 1B to be made through the insulating layer 200, the contacting between the components of the interface protection circuit 110 may be made within any metallization layer of the semiconductor chip. The contact pad 238 of the first n-type region 236A is coupled to the output node OUT of the interface protection circuit 110, e.g., through an external contact pad of the semiconductor chip. The other contact pad 234B2 of the resistor 122 is coupled to the input node IN of the interface protection circuit 110, e.g., through another external contact pad of the semiconductor chip. The contact pad 238 of the second n-type region 236B is coupled to the first power supply line VDD. In various embodiments, the contact pads 238 on the polysilicon substrate layer (including the contact pad 234B1 of the resistor 122 and the other contact pad 234B2 of the resistor 122) may comprise a silicide material, which are formed at the same time as the silicide layers formed on the source/drain regions of the n-channel and p-channel transistors N-TR and P-TR. If silicide material is used, it is also formed in the contact regions of the resistor 122 (at 234A, 234B) and of the first diode 124 and the second diode 126 but interrupted between anode and cathode of the diodes as well as in the resistor region. The contact pads 234B1 and 234B2, the contact pad 238 of the first p-type region 234A, and other contact pads may be connected to bond pads, which may be used to bond using various bonding techniques such as wire bonding, clip bonding, flip chip bonding, and others.

In an alternative embodiment, the resistor 122 may be coupled to the source/drain regions of the n-channel or p-channel transistors N-TR and P-TR. This might be the case especially for 3D-integration when we deal with signal outputs.

Referring to FIG. 1B, the interface protection circuit 110 and the DUP 120 are fabricated in the same chip, i.e., in the same substrate. In particular, all components of the interface protection circuit 110 are formed entirely within the polysilicon. Such a device has multiple advantages.

Significant costs savings may be achieved by using polysilicon based interface protection circuits. For example, since the interface protection circuit 110 is made entirely within polysilicon, the area of additional silicon, i.e., silicon footprint, is reduced significantly compared to integrating the interface protection circuit into silicon substrate. In other words, the polysilicon diodes may be placed in areas of the chip that are used for isolating different regions of the substrate. This is because the polysilicon layer is formed above the surface of the semiconductor substrate.

In contrast, if the protection circuit has to be fabricated within the semiconductor substrate, precious area that is otherwise used for core circuits has to be utilized. Thus, significant reduction in chip size can be achieved using embodiments of the invention. A reduction in chip size directly translates into a large saving in costs as this would increase the yield per wafer.

Additionally, improved isolation between the interface protection circuit and other components of the semiconductor chip may be achieved. This is because the polysilicon devices are formed over thick isolation regions such as shallow trench isolation regions and are therefore completely electrically isolated from the semiconductor substrate. Accordingly, there are no additional parasitic elements in various embodiments of the present invention.

Examples of area savings include, the absence of guard rings around the interface protection circuit due to absence of parasitic effects, improved integration, e.g., the resistor 122 and the second diode 126 are fabricated within the same polysilicon substrate layer 230.

Further, the various embodiments of the invention described herein do not use additional masking steps and share common masks and processes with CMOS processing used for forming the other functional components of the chip. Therefore, they do not introduce additional costs.

Figure 2:
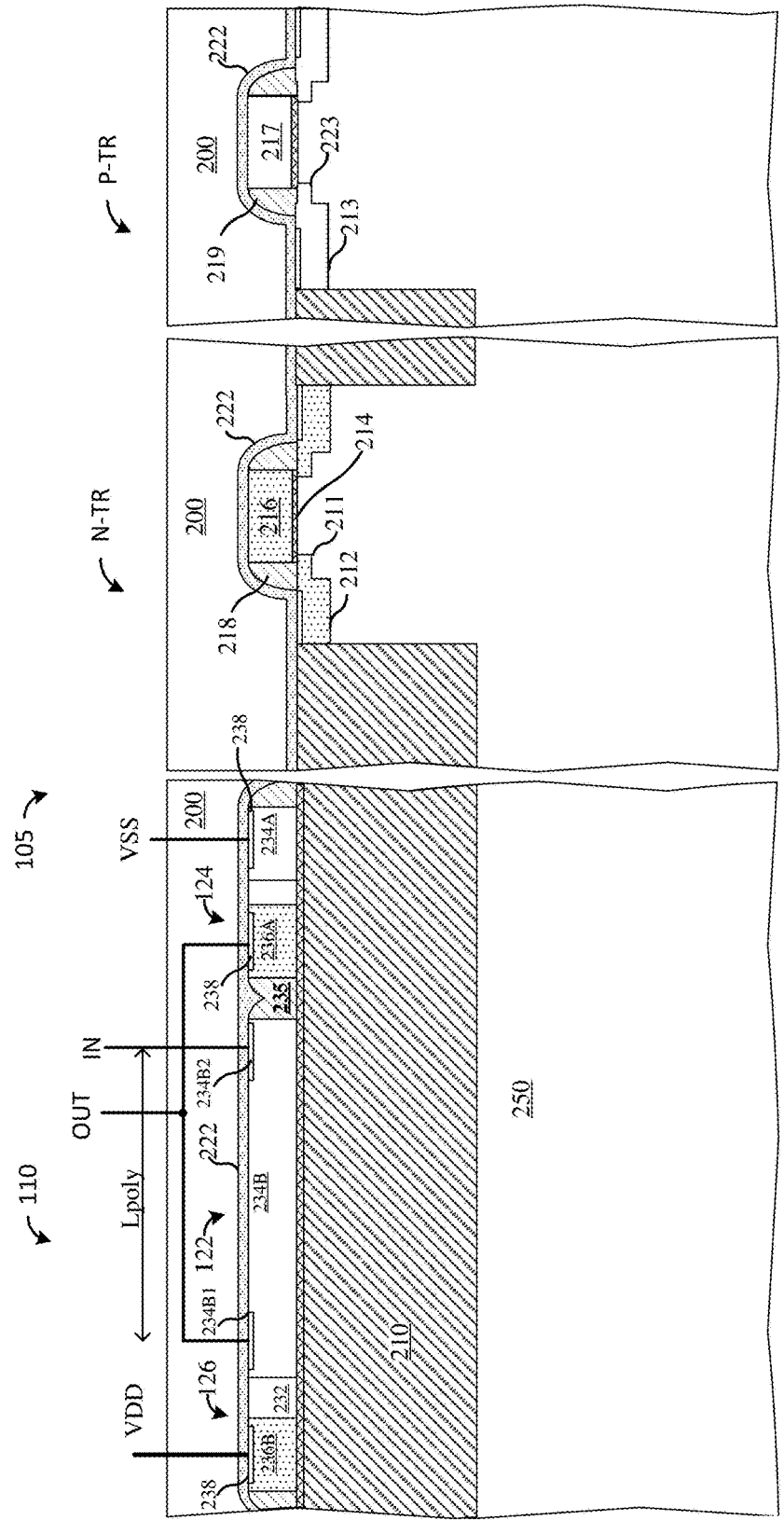
FIG. 2 illustrates a cross-sectional view of a semiconductor device in accordance with an embodiment of the present invention.

FIG. 2 illustrates a cross-sectional view of a semiconductor device in accordance with an embodiment of the present invention.

In one embodiment, the p-type polysilicon regions 234 and the n-type polysilicon regions 236 may extend up to the complete depth of the polysilicon substrate layer 230. For example, the n-type polysilicon regions 236 may be formed using the same implant process as the n-type source/drain regions 212. Similarly, the p-type polysilicon regions 234 may be formed using the same implant process as the p-type source/drain regions 222. In such embodiments, the higher energy-higher dose implants may result in deep heavily doped regions in the polysilicon substrate layer 230. In contrast, when the n-type polysilicon regions 236 are formed using the same implant process as the n-type drain extension regions 211, the n-type polysilicon regions 236 may be shallow (as in FIG. 1B) and may not extend up to the underling gate dielectric layer 214. The embodiment of FIG. 1B may be also accomplished by forming a thicker polysilicon substrate layer 230 over the isolation regions 210 than used to form the first gate 216 and the second gate 217. However, forming a thicker polysilicon substrate layer 230 requires an additional mask so that CMOS regions of the semiconductor chip are protected during the deposition of the additional polysilicon.

Figure 3A:
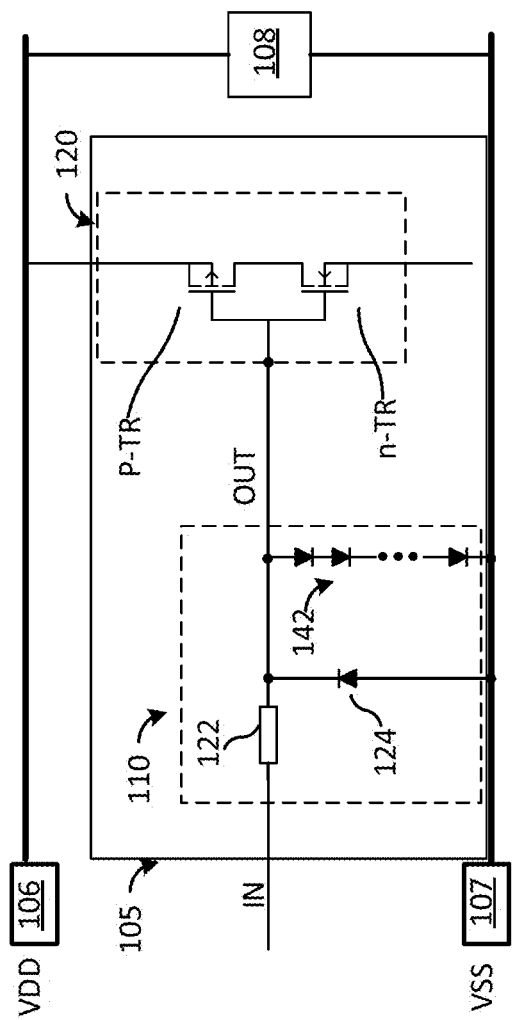
FIG. 3A illustrates a schematic of the ESD protection system comprising a stacked diode in accordance with an alternative embodiment of the present invention.

FIG. 3A illustrates a schematic of the ESD protection system comprising a stacked diode in accordance with an alternative embodiment of the present invention.

During operation, the first power supply line VDD may be switched off to reduce power consumption of functional blocks in the semiconductor chip that are not operating. Therefore, it is possible to have a voltage at the input node IN of the signal line while the first power supply line is off. However, in such cases, when the interface circuit of FIGS. 1A and 1B is used, a leakage path is established between the signal line and the first power supply line VDD through the second diode 126 (in FIG. 1A). As further described below, this embodiment avoids the leakage current. As in the prior embodiment, the semiconductor chip 105 includes the interface protection circuit 110 for protecting the functional circuits. However, the embodiment illustrated in FIGS. 3A and 3B avoids this leakage current by replacing the second diode 126 with a stacked diode 142.

Thus, a negative ESD event at the input node IN will be discharged through the first diode 124 while a positive pulse will be discharged through the stacked diode 142. However, during operation, when a signal line is activated while the first power supply line is powered down, there is no leakage path between the signal line and the first power supply line.

Figure 3B:
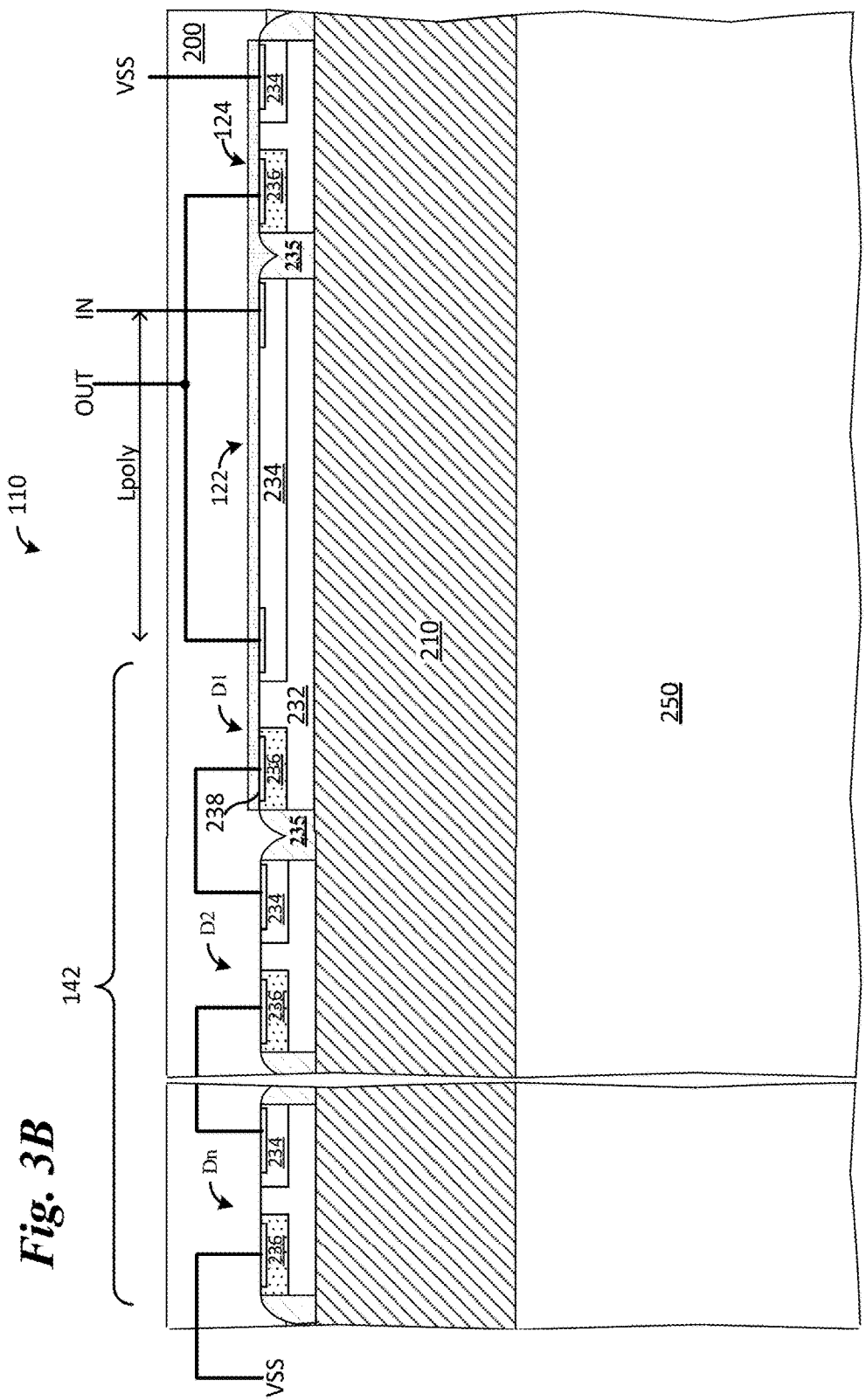
FIG. 3B is a cross-sectional view of a semiconductor device implementing the schematic of FIG. 3A in accordance with an embodiment of the present invention.

FIG. 3B is a cross-sectional view of a semiconductor device implementing the schematic of FIG. 3A in accordance with an embodiment of the present invention.

Referring to FIG. 3B, in various embodiments, the stacked diode 142 and the first diode 124 are integrated in a compact manner. The transistors P-TR and N-TR are not illustrated but are similarly formed as already described using FIG. 1B or FIG. 2. The interface protection circuit 110 comprises a first diode 124 and the resistor 122 as described in prior embodiments.

The stacked diodes 142 includes a series of diodes {D1, D2, . . . Dn} thus formed within the polysilicon substrate layer 230. Advantageously, the individual diodes {D1, D2, . . . Dn} are isolated from each other through the isolation trenches 235. Advantageously, similar to prior embodiments, the isolation trenches 235 may be formed using the processes used to form the spacers in the transistors.

In contrast to the prior embodiment, the first of the stacked diodes D1 between the p-type base region 232 and the n-type polysilicon region 236 is not coupled to a node connected to the first power supply line VDD. Rather, the first of the stacked diodes D1 that is part of the stacked diode 142 is coupled to the second power supply line VSS. The absence of interaction between the various components of the interface protection circuit 110 is even more important in this embodiment than the prior embodiments illustrated in FIGS. 1A-1B and 2. This is because if a stacked diode is formed in a normal bulk semiconductor substrate, additional parasitic bipolar devices are introduced that result in an increase in leakage current. In this embodiment, despite the stacking of the diodes, there is no interaction through the bulk of the semiconductor substrate 250 because of the underling isolation regions 210. In contrast, when stacked diodes are fabricated in a bulk semiconductor substrate, parasitic bipolar devices are formed through the underlying bulk semiconductor substrate despite the presence of trench isolation regions.

Figure 3C:
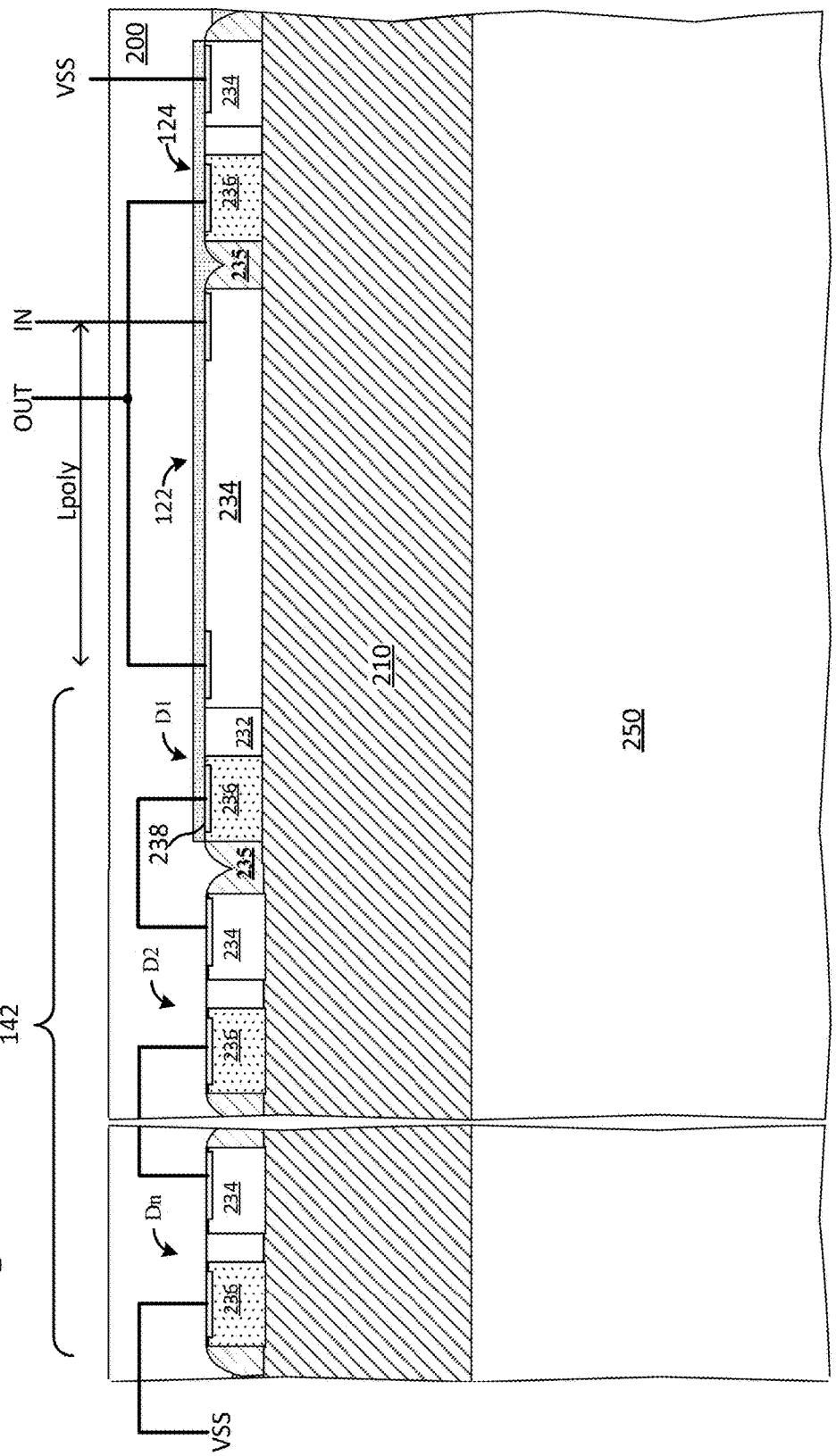
FIG. 3C is a cross-sectional view of a semiconductor device implementing the schematic of FIG. 3A in accordance with an alternative embodiment of the present invention.

FIG. 3C is a cross-sectional view of a semiconductor device implementing the schematic of FIG. 3A in accordance with an alternative embodiment of the present invention.

Unlike the embodiment of FIG. 3B, in this embodiment, the p-type polysilicon regions 234 and the n-type polysilicon regions 236 extend through the p-type base region 232.

FIG. 4A illustrates a schematic of the ESD protection system comprising a stacked diode in accordance with an alternative embodiment of the present invention.

In this embodiment, a bipolar transistor 144 is used instead of the stacked diode of FIG. 3A. Accordingly, the interface protection circuit 110 comprises a resistor 122, a first diode 124, and a bipolar transistor 144.

Figure 4B:
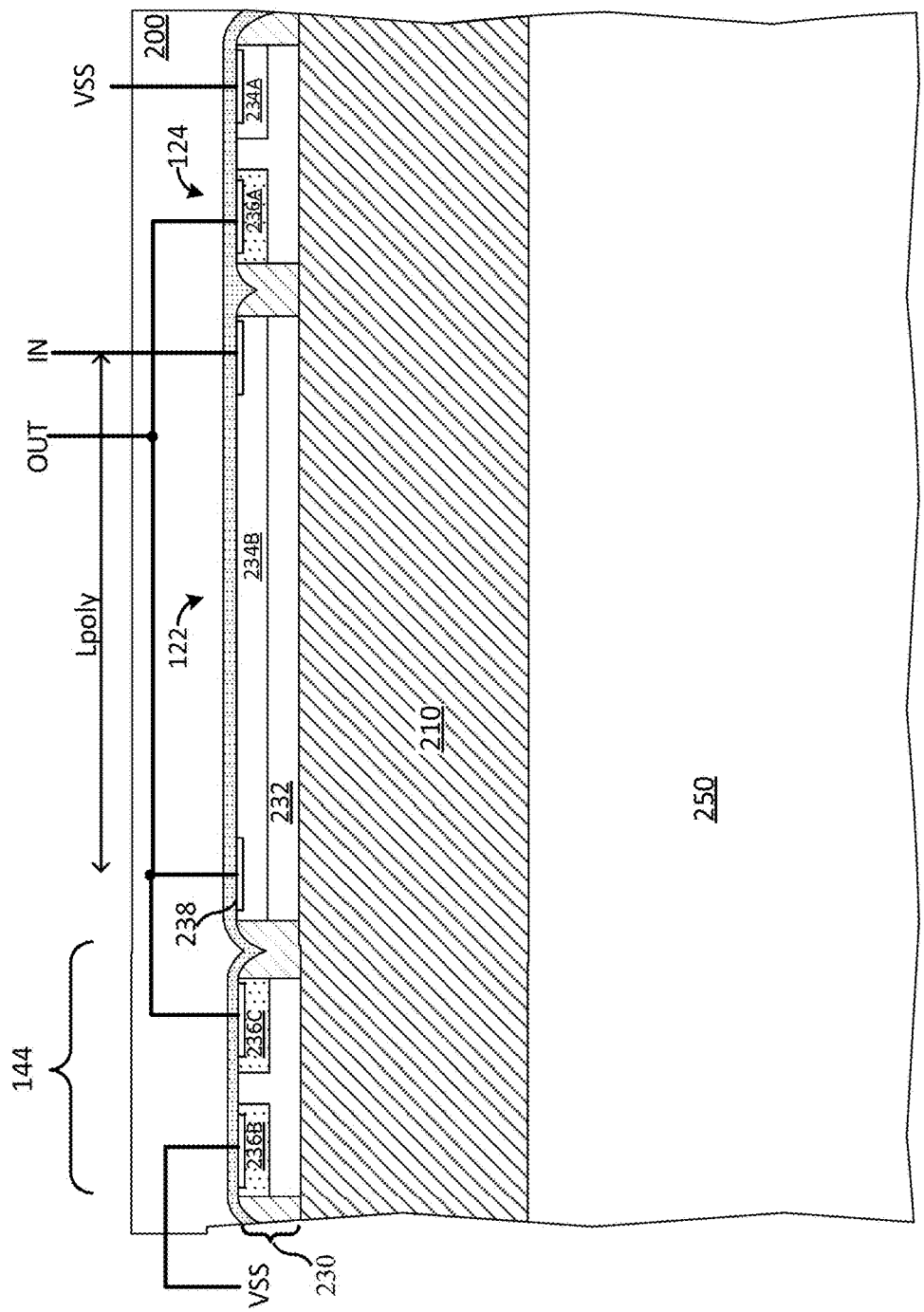
FIG. 4B is a cross-sectional view of a semiconductor device implementing the schematic of FIG. 4A in accordance with an embodiment of the present invention.

FIG. 4B is a cross-sectional view of a semiconductor device implementing the schematic of FIG. 4A in accordance with an embodiment of the present invention.

Referring to FIG. 4B, a bipolar transistor 144 may be integrated into the polysilicon substrate layer 230. The interface protection circuit 110 comprises a first diode 124, and a resistor 122 as described in prior embodiments. Further, the interface protection circuit 110 comprises the bipolar transistor 144. The bipolar transistor 144 comprises a NPN transistor in one embodiment but may be a PNP in another embodiment.

Accordingly, similar to prior embodiments, the first n-type region 236A and the first p-type region 234A form the first diode 124, and the resistor 122 comprises a second p-type region 234B.

The bipolar transistor 144 is also disposed over the isolation region 210 and formed within the polysilicon substrate layer 230. The bipolar transistor 144 comprises a second n-type region 236B and a third n-type region 236C. The second n-type region 236B, the p-type base region 232 of the bipolar transistor 144, and the third n-type region 236C form the bipolar transistor 144. The p-type base region 232 forms the base of the bipolar transistor 144 while the second n-type region 236B, and the third n-type region 236C form the emitter/collector regions.

The contact pads 138 of the resistor 122 and the first diode 124 are coupled as described in prior embodiments. The contact pad 238 of the resistor 122 is coupled to the contact pad 238 of the third n-type region 236C while the contact pad 238 of the second n-type region 236B is coupled to the second power supply line VSS.

Figure 4C:
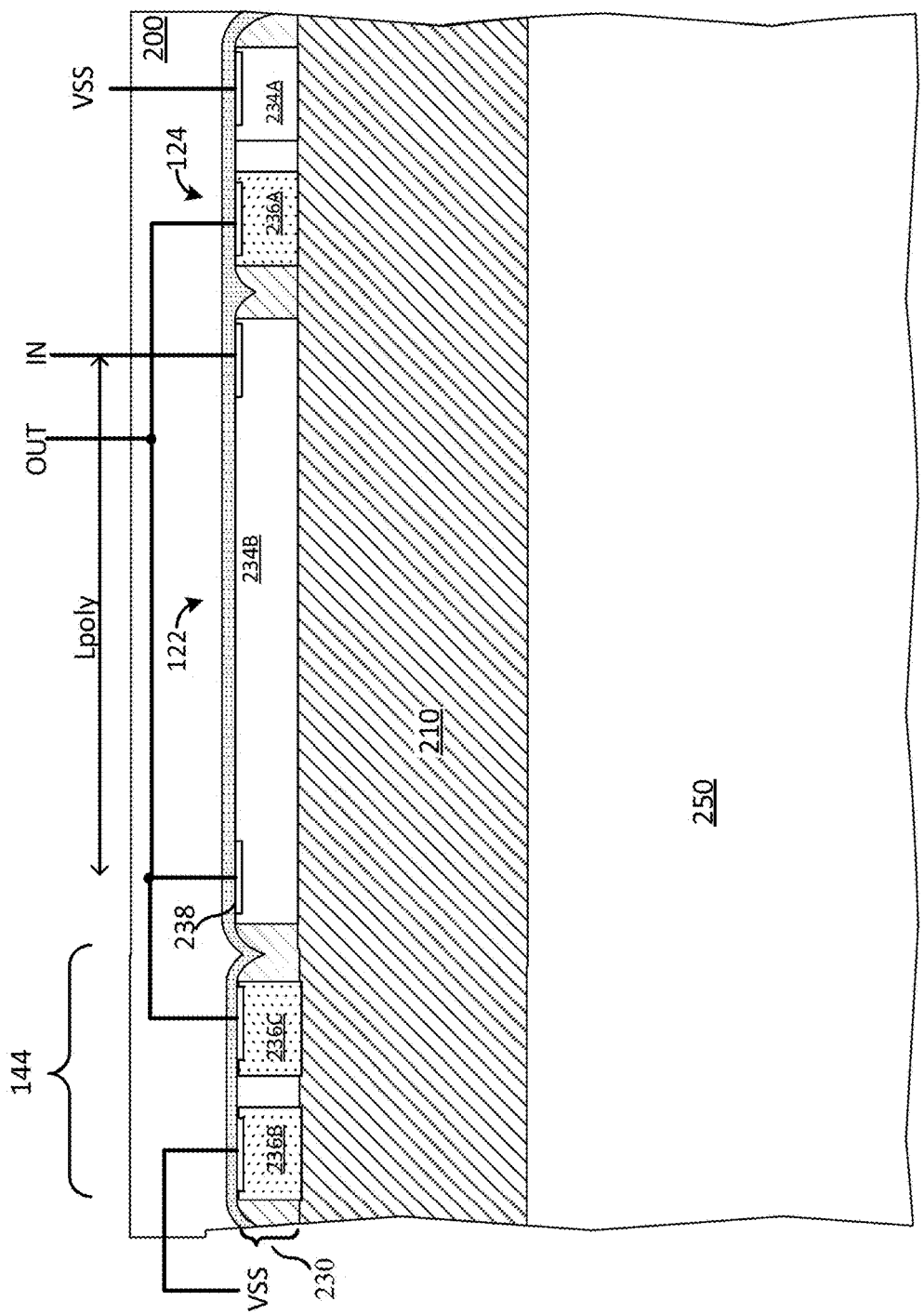
FIG. 4C is a cross-sectional view of a semiconductor device implementing the schematic of FIG. 4A in accordance with an alternative embodiment of the present invention.

FIG. 4C is a cross-sectional view of a semiconductor device implementing the schematic of FIG. 4A in accordance with an alternative embodiment of the present invention.

Unlike the embodiment of FIG. 4B, in this embodiment, the p-type polysilicon regions 234 and the n-type polysilicon regions 236 extend through the polysilicon substrate layer 230.

Figure 5:
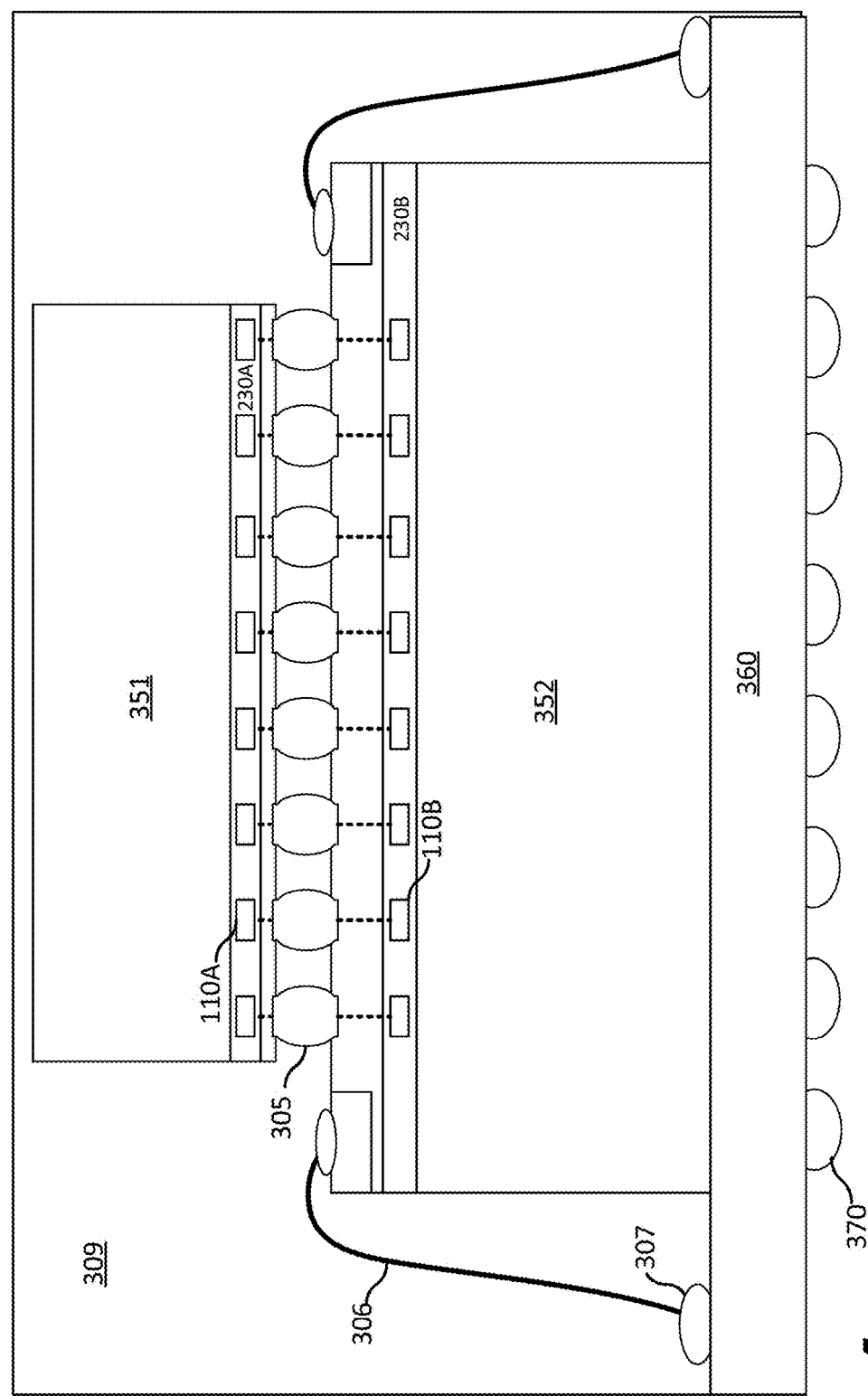
FIG. 5 illustrates a cross-sectional view of a system in package (SiP) in accordance with an embodiment of the present invention.

FIG. 5 illustrates a cross-sectional view of a system in package (SiP) in accordance with an embodiment of the present invention.

In various embodiments, the semiconductor package is a three-dimensional (3-D) stack of semiconductor chips. For example, a first semiconductor chip 351 is stacked over a second semiconductor chip 352. The first semiconductor chip 351 and the second semiconductor chip 352 are connected to each other by a plurality of micro-bumps 305, for example. The stacked chips are embedded within an encapsulating material 309, which may be a molding compound, for example, for protection. Connection from the second semiconductor chip 352 to the carrier 360 may be made through a plurality of wires 306. However, these are example embodiments and other equivalent stacking may be performed.

The package further includes a carrier 360 on which the stacked chips are assembled. The carrier 360 may be a circuit board, ball grid array substrate, lead frame, and others in various embodiments. A plurality of solder balls 370 are formed on the carrier 360 forming the external contacts of the package. The package may be formed to be compliant to any type of package in various embodiments.

In various embodiments, the first semiconductor chip 351 and the second semiconductor chip 352 include the interface protection circuits described in prior embodiments. For example, each of the plurality of micro-bumps 305 is coupled an interface protection circuit. In one illustration, first interface protection circuits 110A are disposed within a first polysilicon substrate layer 230A of the first semiconductor chip 351. Similarly, second interface protection circuits 110B are disposed within a second polysilicon substrate layer 230B of the second semiconductor chip 352.

As described previously, the first and the second interface protection circuits 110A and 110B are integrated within the first and the second polysilicon substrate layers 230A and 230B. As also previously described, such integration results in an area reduction of the overall chip, reduction of parasitic effects without any increase in production costs. The cost savings due to the area reduction can be significant for larger chips.

FIG. 6 illustrates a table illustrating fabrication steps to form the interface protection circuit that are shared with a CMOS process flow in accordance with an embodiment of the present invention.

The table illustrates the processes/masks of the CMOS process flow that may be used to form the device regions of the interface protection circuit within a polysilicon layer, which is formed along with the gate line of the CMOS transistors.

Referring to FIG. 6, for example, the polysilicon substrate layer 230 is formed using the same mask as the gates of the transistors such as the first gate 216 and the second gate 217. The p-type base region 232 is doped in-situ during the formation of the first gate 216 and the second gate 217.

The doping of the p-type polysilicon regions 234 may be introduced at the same time (and mask) as the p-type source/drain regions 222 as well as optionally the doping of the second gate 217. In other words, when the p-type source/drain regions 222 are opened for implantation with p+ dopants, the regions of the p-type polysilicon regions 234 are also opened. Similarly, the n-type polysilicon regions 236 are formed at the same time (and mask) as the n-type source/drain regions 212 as well as optionally the doping of the first gate 216. The isolation trench 235 is formed along with the spacers 218/219 in some embodiments. If the spacing between the components of the interface protection circuit 110 is larger, then the etch stop liner 222 and portions of the insulating layer 220 may also be formed between the components of the interface protection circuit 110. The contacts pads 238 are formed during the same process and mask as the silicide contacts to the transistors. Accordingly, all processes and masks that are used to form the interface protection circuit are advantageously shared with a CMOS process flow.

In some embodiments, the CMOS process flow, n-channel and p-channel FINFETs. Advantageously, embodiments of the present invention may be easily incorporated with such technology using the same shared processes.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a first active device of a first transistor disposed in a first semiconductor substrate;
   a first isolation layer disposed at the first semiconductor substrate; and a first polysilicon substrate layer disposed over the first isolation layer and the first semiconductor substrate, the first polysilicon substrate layer comprising a first semiconductor device region of a first interface protection circuit of the first transistor, wherein the first interface protection circuit comprises:
  a first device region of a first doping type disposed in a first region of the first polysilicon substrate layer, the first device region comprising doped polysilicon that is doped with the first doping type;
  a second device region of a second doping type disposed in the first region of the first polysilicon substrate layer, the second doping type being opposite to the first doping type, the first device region and the second device region forming a first diode, the first device region being disposed in the second device region, wherein a first top surface of the first device region is coplanar with a second top surface of the second device region, wherein a first bottom surface of the first device region opposing the first top surface is disposed within the second device region, and wherein the first device region and the second device region form a first p-n junction oriented parallel to a major surface of the first polysilicon substrate layer and a second p-n junction oriented perpendicular to the major surface; and
  a third device region of the second doping type disposed in a second region of the first polysilicon substrate layer, the second region being separated from the first region by a first trench isolation, the third device region comprising a base layer and an upper layer disposed in the base layer, the upper layer comprising a first contact pad at a first end and a second contact pad at a second end, wherein an upper top surface of the upper layer is coplanar with a base top surface of the base layer, wherein an upper bottom surface of the upper layer opposing the upper top surface is disposed within the base layer, wherein the third device region comprises a polysilicon resistor disposed between the first end and the second end, and wherein the base layer and the upper layer each comprise polysilicon.

2. The semiconductor device of claim 1, wherein the first interface protection circuit is configured to protect the first transistor from an electrostatic discharge current at an internal or external input/output node coupled to the first transistor.

3. The semiconductor device of claim 1, wherein the first semiconductor device region comprises one or more of diodes, transistors, and resistors.

4. The semiconductor device of claim 1, the first interface protection circuit further comprising:
  a fourth device region of the first doping type disposed in the second region of the first polysilicon substrate layer, the third device region and the fourth device region forming a second diode.

5. The semiconductor device of claim 4, wherein the first transistor comprises a gate coupled to a signal line through the first interface protection circuit, wherein the polysilicon resistor is coupled between the signal line and the gate of the first transistor, and wherein the first diode is coupled between the signal line and a negative power supply line and the second diode is coupled between the signal line and a positive power supply line.

6. The semiconductor device of claim 4, wherein the first transistor comprises a drain coupled to a signal line through the first interface protection circuit, wherein the polysilicon resistor is coupled between the signal line and the drain of the first transistor, and wherein the first diode is coupled between the signal line and a negative power supply line and the second diode is coupled between the signal line and a positive power supply line.

7. The semiconductor device of claim 4, further comprising:
  a second active device of a second transistor disposed in a second semiconductor substrate;
  a second isolation layer disposed at the second semiconductor substrate; and
  a second polysilicon substrate layer disposed over the second isolation layer and the second semiconductor substrate, the second polysilicon substrate layer comprising a second semiconductor device region of a second interface protection circuit of the second transistor; and
  a bump coupled to the first interface protection circuit and the second interface protection circuit, wherein the first semiconductor substrate is stacked over the second semiconductor substrate using the bump.

8. The semiconductor device of claim 1, further comprising:
  a second active device of a second transistor disposed in a second semiconductor substrate;
  a second isolation layer disposed at the second semiconductor substrate; and
  a second polysilicon substrate layer disposed over the second isolation layer and the second semiconductor substrate, the second polysilicon substrate layer comprising a second semiconductor device region of a second interface protection circuit of the second transistor; and
  a bump coupled to the first interface protection circuit and the second interface protection circuit, wherein the first semiconductor substrate is stacked over the second semiconductor substrate using the bump.

9. A semiconductor package comprising a first chip, wherein the first chip comprises:
  a first semiconductor substrate;
  a first polysilicon substrate layer disposed over the first semiconductor substrate;
  a first plurality of interface protection circuits disposed in the first polysilicon substrate layer; and
  a first plurality of bond pads, each of the first plurality of interface protection circuits associated with a corresponding one of the first plurality of bond pads, wherein each of the first plurality of interface protection circuits comprises:
    a first device region of a first doping type disposed in a first region of the first polysilicon substrate layer, the first device region comprising doped polysilicon that is doped with the first doping type;
    a second device region of a second doping type disposed in the first region of the first polysilicon substrate layer, the second doping type being opposite to the first doping type, the first device region and the second device region forming a first diode, the first device region being disposed in the second device region, wherein a first top surface of the first device region is coplanar with a second top surface of the second device region, wherein a first bottom surface of the first device region opposing the first top surface is disposed within the second device region, and wherein the first device region and the second device region form a first p-n junction oriented parallel to a major surface of the first polysilicon substrate layer and a second p-n junction oriented perpendicular to the major surface; and a third device region of the second doping type disposed in a second region of the first polysilicon substrate layer, the second region being separated from the first region by a first trench isolation, the third device region comprising a base layer and an upper layer disposed in the base layer, the upper layer comprising a first contact pad at a first end and a second contact pad at a second end, wherein an upper top surface of the upper layer is coplanar with a base top surface of the base layer, wherein an upper bottom surface of the upper layer opposing the upper top surface is disposed within the base layer, wherein the third device region comprises a polysilicon resistor disposed between the first end and the second end, and wherein the base layer and the upper layer each comprise polysilicon.

10. The semiconductor package of claim 9, wherein the first plurality of bond pads are all contact pads of the first chip.

11. The semiconductor package of claim 9, further comprising a second chip, wherein the second chip comprises:
a second semiconductor substrate;
a second polysilicon substrate layer disposed under the second semiconductor substrate;
a second plurality of interface protection circuits disposed in the second polysilicon substrate layer; and
a second plurality of bond pads, each of the second plurality of interface protection circuits associated with a corresponding one of the second plurality of bond pads.

12. The semiconductor package of claim 11, wherein the second chip is disposed over the first chip, wherein the first plurality of bond pads is coupled to the second plurality of bond pads.

13. The semiconductor package of claim 11, further comprising an encapsulation material disposed around the first chip and the second chip.

14. A semiconductor device comprising:
a first active device of a first transistor disposed in a semiconductor substrate;
a first isolation layer disposed at the semiconductor substrate;
a gate dielectric layer disposed over the first isolation layer;
a first polysilicon substrate layer disposed over the gate dielectric layer and the semiconductor substrate, the first polysilicon substrate layer comprising:
a base layer of a first doping type disposed in a first region of the first polysilicon substrate layer;
a first device region disposed in the base layer, the first device region having a second doping type, the second doping type being opposite to the first doping type, the first device region being disposed in the base layer, wherein a first top surface of the first device region is coplanar with a base top surface of the base layer, wherein a first bottom surface of the first device region opposing the first top surface is disposed within the base layer, wherein the first device region comprises doped polysilicon that is doped with the second doping type, and wherein a first p-n junction and a second p-n junction are disposed at an intersection between the base layer and the first device region, the first p-n junction oriented parallel to a major surface of the first polysilicon substrate layer and the second p-n junction oriented perpendicular to the major surface; and
a second device region of the first doping type disposed in the first region of the first polysilicon substrate layer, the second device region being disposed in the base layer and comprising a first contact pad at a first end and a second contact pad at a second end, the first device region and the second device region being separated by a portion of the base layer, the second device region comprising a resistor between the first end and the second end wherein a second top surface of the second device region is coplanar with the base top surface, and wherein a second bottom surface of the second device region opposing the second top surface is disposed within the base layer, and wherein the second device region comprises doped polysilicon that is doped with the first doping type.

* * * * *